United States Patent
Chang et al.

(10) Patent No.: US 6,998,718 B2
(45) Date of Patent: Feb. 14, 2006

(54) WAFER LEVEL CHIP SCALE PACKAGING STRUCTURE AND METHOD OF FABRICATING THE SAME

(75) Inventors: Shu-Ming Chang, Hsinchu (TW); Lee-Cheng Shen, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 91 days.

(21) Appl. No.: 10/765,961

(22) Filed: Jan. 29, 2004

(65) Prior Publication Data
US 2005/0104226 A1 May 19, 2005

(30) Foreign Application Priority Data
Nov. 14, 2003 (TW) .......................... 092131918

(51) Int. Cl.
*H01L 23/52* (2006.01)
*H01L 23/48* (2006.01)
*H01L 29/40* (2006.01)

(52) U.S. Cl. ........................... 257/781; 257/780
(58) Field of Classification Search ................ 257/780, 257/781, 758, 783, 777
See application file for complete search history.

(56) References Cited

U.S. PATENT DOCUMENTS

| | | | |
|---|---|---|---|
| 5,834,844 A | * 11/1998 | Akagawa et al. | 257/734 |
| 5,925,931 A | * 7/1999 | Yamamoto | 257/737 |
| 6,023,103 A | 2/2000 | Chang et al. | |
| 6,407,459 B2 | * 6/2002 | Kwon et al. | 257/780 |
| 6,441,487 B2 | * 8/2002 | Elenius et al. | 257/738 |
| 6,621,164 B2 | * 9/2003 | Hwang et al. | 257/738 |
| 2002/0127768 A1 | 9/2002 | Badir et al. | |

OTHER PUBLICATIONS

Hamano et al, "Super CSP™: WLCSP Solution for Memory and System LSI" International Symposium on Advanced Packaging Materials, 1999, pp. 221–225.

Kazama et al, "Development of Low–cost and Highly Reliable Wafer Process Package" Electronic Components and Technology Conference, 2001, 7 pages.

* cited by examiner

*Primary Examiner*—S. V. Clark
(74) *Attorney, Agent, or Firm*—Birch, Stewart, Kolasch & Birch, LLP

(57) ABSTRACT

A wafer level chip scale packaging structure and the method of fabricating the same are disclosed to form a sacrificial layer below the bump using a normal semiconductor process. The bump is used to connect the signals between the Si wafer and the PCB. The interface between the sacrificial layer and the PCB is the weakest part in the whole structure. When the stress applied to the bump is overloaded, the interface between the sacrificial layer and the PCB will crash to remove the stress generated by different thermal expansion coefficients of the Si wafer and the PCB. The sacrificial layer would help avoid the crash occurring to the bump to protect the electrical conduction between the Si wafer and the PCB.

12 Claims, 6 Drawing Sheets

WAFER LEVEL CHIP SCALE PACKAGING STRUCTURE AND METHOD OF FABRICATING THE SAME

This Nonprovisional application claims priority under 35 U.S.C. § 119(a) on Patent Application No(s). 092131918 filed in TAIWAN on Nov. 14, 2003, the entire contents of which are hereby incorporated by reference.

BACKGROUND OF THE INVENTION

1. Field of Invention

The invention relates to a wafer level chip scale packaging structure and the method of fabricating the same. In particular, the invention relates to a wafer level chip scale packaging structure that uses a specially designed sacrificial layer material, interface crashes, or the elasticity of a suspension structure to remove the stress generated due to differential thermal expansion coefficients between the silicon (Si) wafer and the printed circuit board (PCB).

2. Related Art

The wafer level chip scale packaging is a very important technique for the packaging of wafers and PCB. The main difference from the conventional flip chip in package technique is: as the thermal expansion coefficients between the wafer (Si) and the PCB material is very large, it is likely to have some cracks at the solder ball joints during the reliability test after the wafer is assembled.

Therefore, one usually includes an underfill step in the technique of flip chip in package to protect the solder ball joint from being damaged. However, the underfill step is very time-consuming and it is very hard to repair once the process is completed. Therefore, the wafer level chip scale packaging is developed to replace the conventional flip chip in package technique. Since this kind of wafer level chip scale packaging techniques has superior electrical performance and lower manufacturing costs than other packaging forms and belongs to re-workable packaging techniques, it will play an important role in the production of future electronics.

We describe the developed wafer level chip scale packaging techniques in the following paragraphs. FIG. 1 shows the packaging structure disclosed by the Japanese Hitachi, Ltd in Electronic Components and Technology Conference (p.40 to p.46) in 2001. This technique is used in the packaging of Si wafer 10 and organic PCB 20. Its main spirit is to put an extremely soft elastic layer 40 at the bottom of the solder ball 30. The elastic layer 40 releases the stress generated due to the differential thermal expansion coefficients between the Si wafer 10 and the organic PCB 20. However, there are not many choices suitable for the elastic layer 40. It has its technical bottleneck in manufacturing. Therefore, its applications are limited to the packaging of integrated circuits (IC) with a wide pitch (low number of pins).

FIG. 2 shows a chip-scale carrier for semiconductor devices including mounted spring contacts disclosed in the U.S. Pat. No. 6,023,103. The technique uses an elastic metal wire 50 as the channel connecting a Si wafer 10 and an organic PCB 20. Using the elasticity of the metal wire 50, the stress generated by the differential thermal expansion coefficients between the Si wafer 10 and the organic PCB 20 can be removed. However, the metal wire is formed by bonding. To enhance its strength, one has to employ a special process to strengthen the metal. This inevitably increases the manufacturing cost.

FIG. 3 shows the Super CSP structure proposed by Fujitsu, Ltd. The technique uses a semiconductor process to grow a copper post 60 of about 100 micrometer high as the electrical contact between the Si wafer 10 and the organic PCB 20. However, using this structure to alleviate the stress is not perfect. Moreover, to grow such a copper post 60 and to protect the copper from being oxidized will increase the cost. Therefore, it is not practical.

FIG. 4 shows the wafer level packaging structure disclosed in the U.S. Pat. Application No. 2002/0127768 A1. Its main technical feature is to form a vent hole 80 below a conductive bump 70. Using the vent hole 80 to replace the elastic layer 40 in FIG. 1 can obtain a better elastic effect. However, the vent hole 80 requires a special material and an accompanying fabricating process. Therefore, it has some limitation in mass production.

In considering the reliability of the products, most packaging techniques can be applied to IC elements with a small pin number (smaller than 100 I/O ports) and area and cannot be used for future IC elements with a large pin number and area.

Therefore, for an optimized packaging (such as wafer level packaging) of future electronic devices that have a larger pin number, many functions, and a large chip size (such as system of single chip or system packaging), it is imperative to find a method to minimize the manufacturing cost and the packaging volume/surface.

SUMMARY OF THE INVENTION

In view of the foregoing, an objective of the invention is to provide a wafer level packaging structure and the method of fabricating it. The invention uses the usual semiconductor process to form a sacrificial layer below the bump using a normal semiconductor process. The bump is used to connect the signals between the Si wafer and the PCB. The interface between the sacrificial layer and the PCB or the sacrificial layer material is the weakest part in the whole structure. When the stress applied to the bump is overloaded, the interface between the sacrificial layer and the PCB or the sacrificial layer material will crash to remove the stress generated by different thermal expansion coefficients of the Si wafer and the PCB. The sacrificial layer can help avoid the crash occurring to the bump to protect the electrical conduction between the Si wafer and the PCB. The sacrificial layer can be removed to form a suspension part below the bump, the elasticity of which removes the stress generated by different thermal expansion coefficients of the Si wafer and the PCB.

The basic packaging structure of the invention includes: a substrate, an insulating layer, a metal wire, a bump, and a passivation layer. The substrate has electrical communications with the PCB via the bump.

The substrate part is the Si wafer. After forming the required circuit layout on the substrate using semiconductor processes, external signals can enter through the pads on its surface to control the actions of the substrate.

The insulating layer is formed on the substrate with a connection part and a suspension part. The connection part is directly connected to the substrate. The suspension part is suspended above the substrate and connected to the connection part.

Afterwards, the metal wire is pulled from the original pads to above the suspension part using the circuit redistribution layer technique. The bump is grown above the suspension part to electrically connect the pads and the bump. The substrate and the PCB thereabove are thus in electrical communications. Finally, a passivation layer is formed above the metal wire to protect the whole packaging structure from being damaged.

Since the wafer level packaging structure is fabricated using mature semiconductor processes, the structure and method can be used for mass production.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
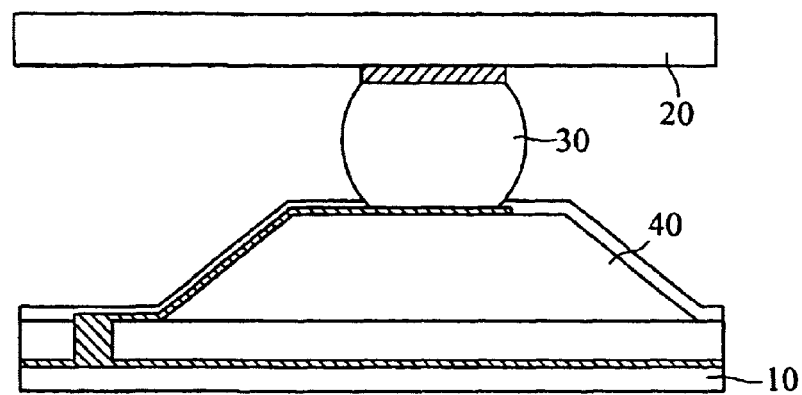
FIG. 1 is a schematic view of the conventional packaging structure that utilizes an elastic layer to release the stress generated by the differential thermal expansion coefficients between the Si wafer and the PCB.
Figure 2:
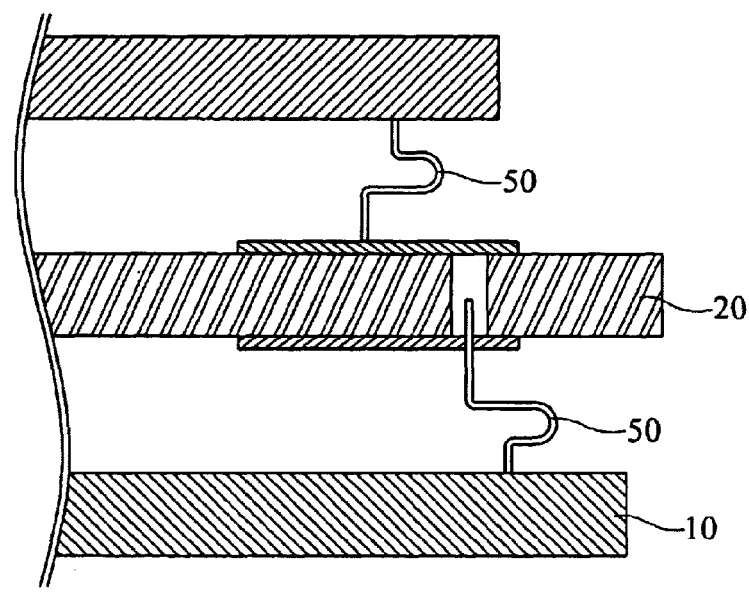
FIG. 2 is a schematic view of the conventional wafer level carrier structure for semiconductor devices.
Figure 3:
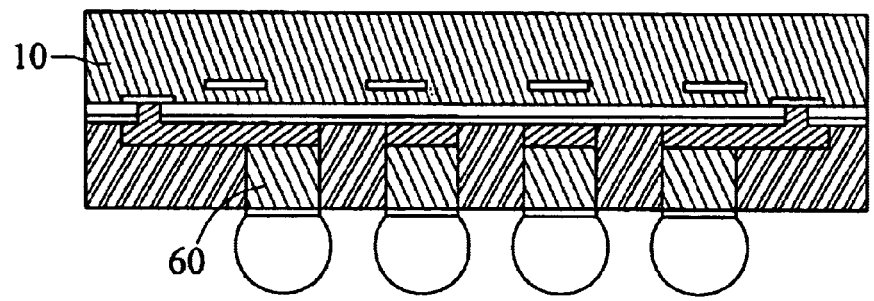
FIG. 3 is a schematic view of the Super CSP structure proposed by Fujitsu, Ltd.
Figure 4:
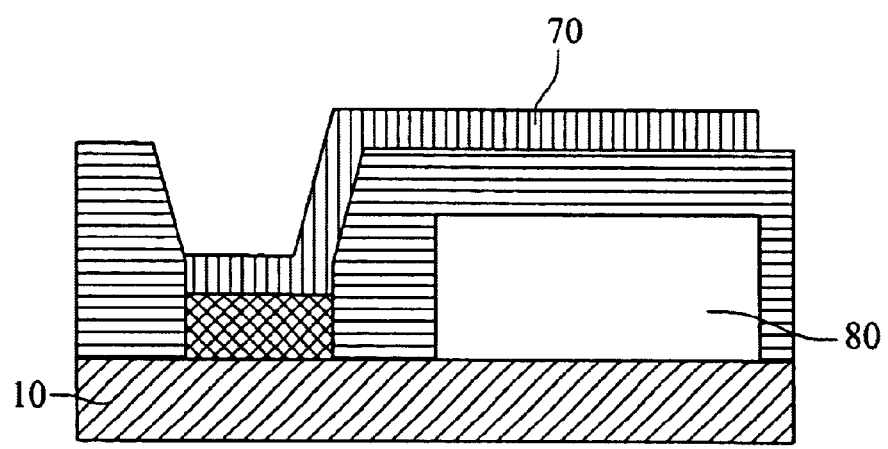
FIG. 4 is a schematic view of the wafer level packaging structure disclosed by the U.S. Pat. Application No. 2002/0127768 A1.
Figure 5:
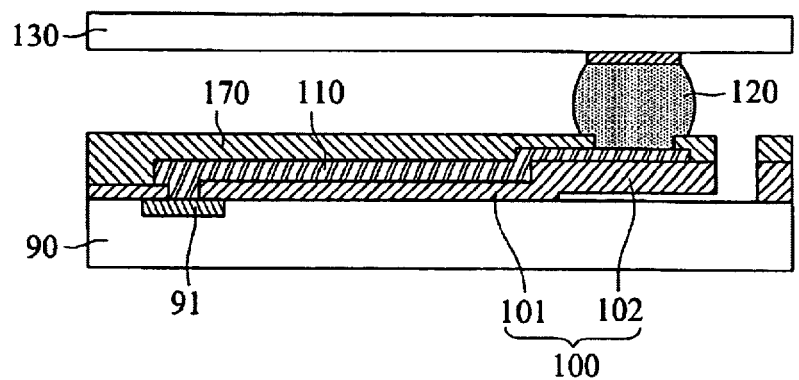
FIG. 5 is a cross-sectional view of the packaging according to the first embodiment.
Figure 6:
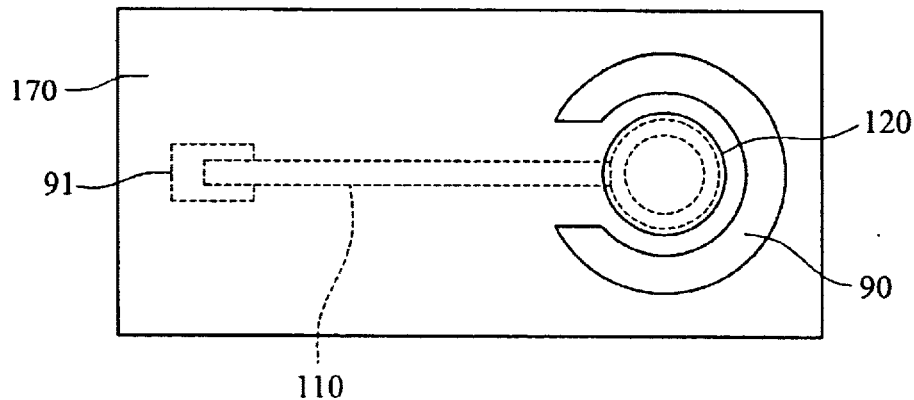
FIG. 6 is a top view of the packaging according to the first embodiment.

With reference to FIGS. 5 and 6, the cross-sectional and top views of the packaging structure according to the first embodiment of the invention, respectively, the structure contains: a substrate 90, an insulating layer 100, a metal wire 110, a bump 120, and a passivation layer 170. The electrical connection between the substrate 90 and the PCB 130 is achieved using the bump 120.

The substrate 90 is usually a Si wafer. After forming the required circuit layout on the substrate 90 using semiconductor processes, external signals can enter through the pads 91 on its surface to control the actions of the substrate 90.

The insulating layer 100 is formed on the substrate 90 with a connection part 101 and a suspension part 102. The connection part 101 is directly formed on the substrate 90, exposing the surfaces of all the pads 91 for the connection of the metal wire 110. The suspension part 102 is suspended above the substrate 90 and connected to the connection part 101.

Since the pads 91 on the substrate 90 are formed using semiconductor processes, their pitch is very small. Although the same pitch can be fabricated on the PCB 130, it has a higher cost though.

To solve this problem, the redistribution layer (RDL) technique based upon the basic bump process is applied to wafers. Its primary objective is to widen the pitch on the PCB 130 through re-building the distribution of I/O ports (the bump 120 in the drawing). The ultimate goal is to reduce the fabrication cost of the PCB.

The metal wire 110 is pulled from the original pads 91 to above the suspension part 102 using the circuit RDL technique. The bump 120 is grown above the suspension part 102 to electrically connect the pads 91 and the bump 120. The substrate 90 and the PCB 130 thereabove are thus in electrical communications. Finally, a passivation layer 170 is formed above the metal wire 110 to protect the substrate 90 and the packaging structure from being damaged.

The invention uses the suspension part 102 as a protection pad (bump 120) design. When a stress is generated due to the different thermal expansion coefficients between the substrate 90 and the PCB 130, the tiny oscillations of the suspension 102 release such a stress. It prevents the cracks at the solder balls in the prior art. Therefore, the invention can protect the electrical connections between the pads 91 on the substrate 90 and the bump 120.

Figure 7:
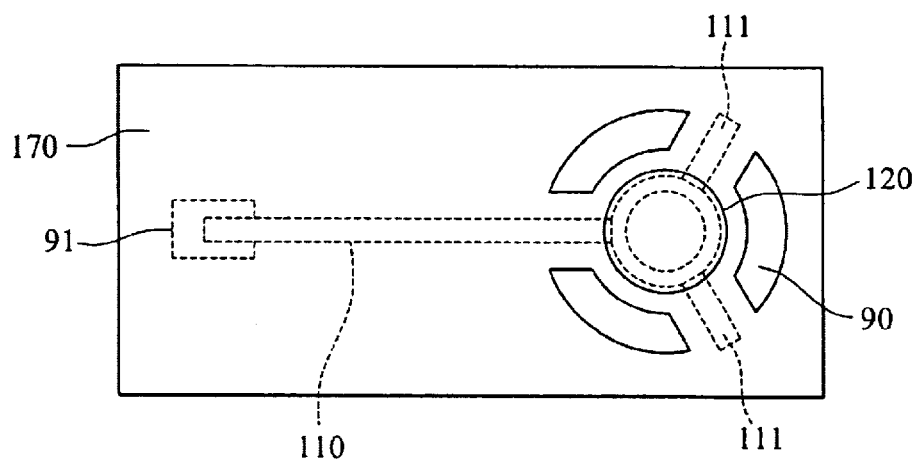
FIG. 7 is a top view of the packaging according to the second embodiment.

FIG. 7 shows a top view of the second embodiment. Its structure is roughly the same as the first embodiment. However, it further contains several suspension beams 111 connecting to the bump 120. The suspension beams 111 are fabricated at the same time as the metal wire 110 (but without being connected to the pads 91) and installed above the insulating layer 100. They can further enhance the structural strength.

Figure 8:
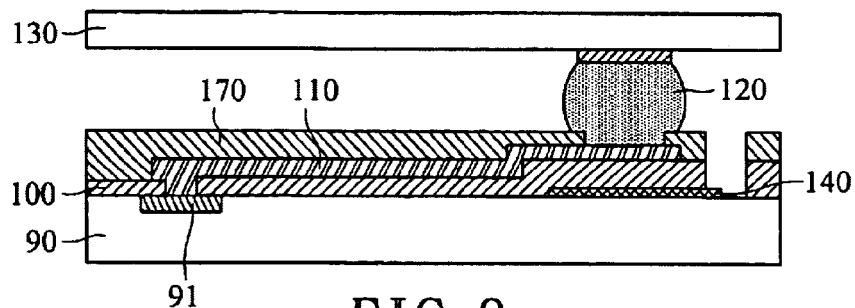
FIG. 8 is a cross-sectional view of the packaging according to the third embodiment.

FIG. 8 shows the third embodiment of the invention. Its structure is roughly the same as the first embodiment. It further contains a sacrificial layer 140 installed between the substrate 90 and the suspension part 102 of the insulating layer 100, right below the bump 120.

The connection part of the sacrificial layer 140 and the substrate 90 is weakest in the interfacial adhesive force or in the material of the complete structure. Therefore, when the stress on the bump 120 is too large, the connection part will break to release the stress between the substrate 90 and the PCB 130 while still keeping the electrical connection between the pads 91 on the substrate 90 and the bump 120. The material of the sacrificial layer 140 can be metals, epoxy, organic polymers, inorganic oxides, etc, as long as the interfacial adhesive force with the substrate 90 or the sacrificial layer material has the weakest mechanical strength in the complete structure.

Likewise, the packaging structure in the third embodiment can have several suspension beams 111 (not shown) connecting to the bump 120. The suspension beams 111 are fabricated at the same time as the metal wire 110 (but without being connected to the pads 91) and installed above the insulating layer 100. They can further enhance the structural strength.

Figure 9:
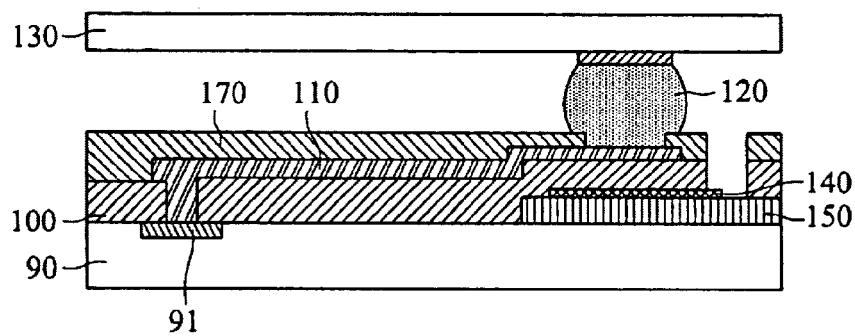
FIG. 9 is a cross-sectional view of the packaging according to the fourth embodiment.

FIG. 9 shows the fourth embodiment of the invention. Its structure is roughly the same as the first embodiment. It further contains an elastic layer 150 and a sacrificial layer 140. The sacrificial layer 140 is installed above the elastic layer 150. Both of them are sandwiched between the substrate 90 and the suspension part 102 of the insulating layer 100, right below the bump 120. The elastic layer 150 is made of an elastic material.

When the stress on the bump 120 is overloaded, it is absorbed by the elasticity of the elastic layer 150, protecting the electrical connection between the bump 120 and the pad 91. Likewise, the packaging structure in the fourth embodiment can be installed with several suspension beams 111 (not shown) connecting to the bump 120 to fortify the structural strength.

Figure 10:
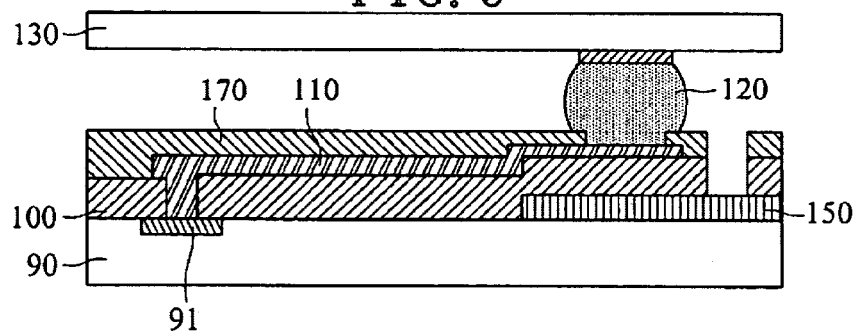
FIG. 10 is a cross-sectional view of the packaging according to the fifth embodiment.

FIG. 10 shows the fifth embodiment of the invention. Its structure is similar to the first embodiment. However, it further contains an elastic layer 150 installed between the substrate 90 and the suspension part 102 of the insulating layer 100, right below the bump 120. The adhesive force between the elastic layer 150 and the insulating layer 100 is smaller than that between the connection part 101 of the insulating layer 100 and the substrate 90. Therefore, when the stress between the substrate 90 and the PCB 130 is too large, the connection part between the elastic layer 150 and insulating layer 100 cracks to release the stress. Likewise, there can be several suspension beams 111 connecting to the bump 120 to fortify the structural strength.

Figure 11:
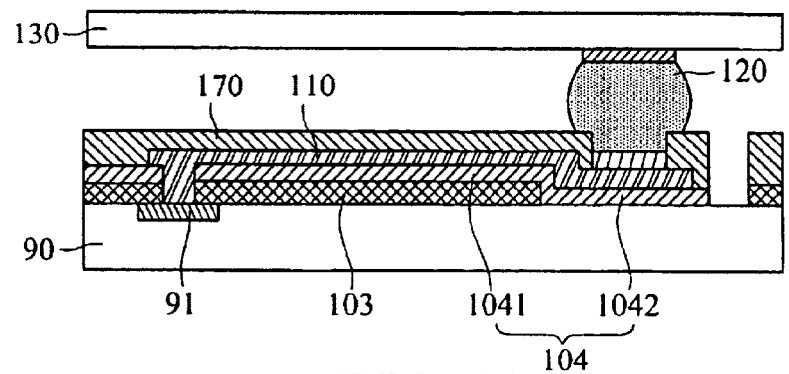
FIG. 11 is a cross-sectional view of the packaging according to the sixth embodiment.

FIG. 11 shows the sixth embodiment of the invention. Its structure is slightly different from the first embodiment. It mainly contains a substrate 90, a first insulating layer 103, a second insulating layer 104, a metal wire 110, a bump 120, and a passivation layer 170.

The substrate 90 contains pads 91 for external signals to enter and control the actions of the substrate 90.

The first insulating layer 103 is installed on the substrate 90 to expose all the pads 91. The second insulating layer 104 contains a first connection part 1041 and a second connection part 1042 connected with each other. The first connection part 1041 is installed on the first insulating layer 103. The second connection part 1042 is directly connected to the substrate 90. The adhesive force between the second connection part 1042 and the substrate 90 is smaller than that between the first connection part 1041 and the substrate 90. Therefore, when the stress between the substrate 90 and the PCB 130 is too large, the connection between the second connection part 1042 and the substrate 90 cracks to release the stress.

Likewise, there can be several suspension beams 111 (not shown) connecting to the bump 120 in the sixth embodiment to fortify the structural strength.

Figure 12A:
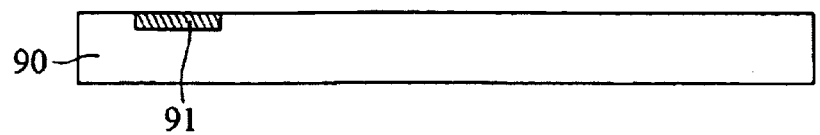
FIGS. 12A to 12G are plots showing the fabricating process for the first embodiment.
Figure 12B:
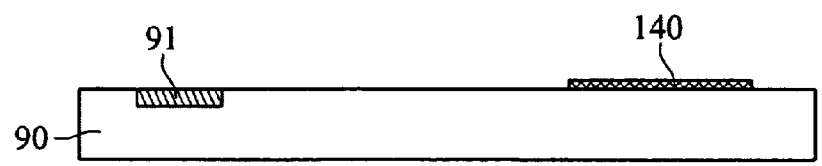

We use FIGS. 12A to 12G to explain the fabricating process for the first embodiment of the invention. As shown in FIG. 12A, a pad 91 is formed on the substrate 90. As shown in FIG. 12B, a sacrificial layer 140 is formed at a position on the substrate 90 corresponding to the position of the bump 120 to be formed.

Figure 12C:
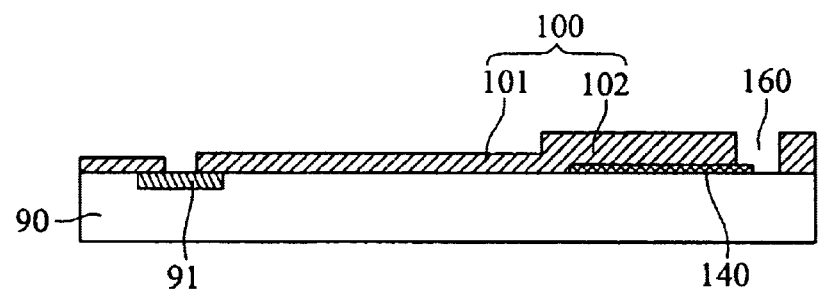

As shown in FIG. 12C, an insulating layer 100 is formed on the substrate 90. An opening 160 is formed at an appropriate position on the substrate 90 and the insulating layer 100 as the etching window for the suspension part 102.

Figure 12D:
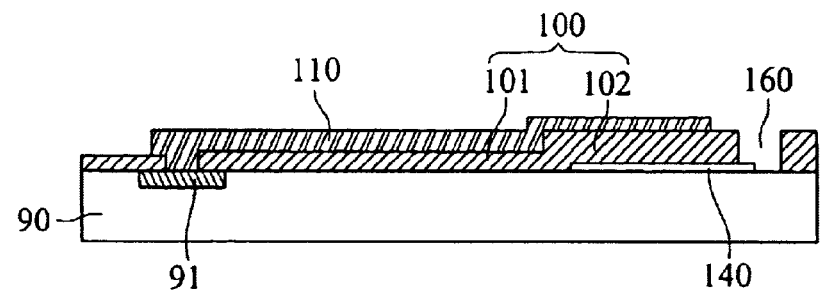
Figure 12E:
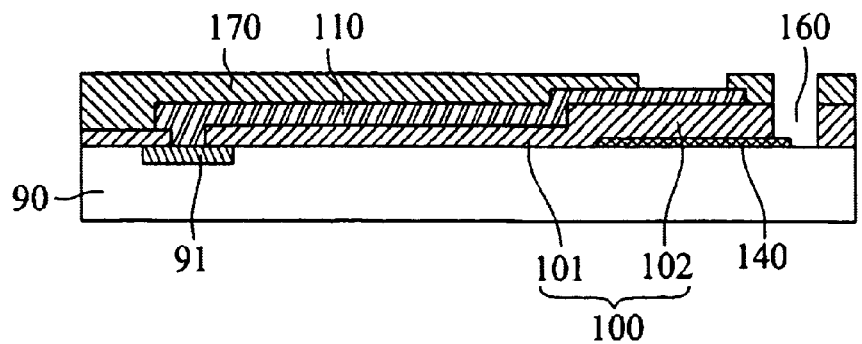

As shown in FIG. 12D, a metal wire 110 is formed on the insulating layer 100. One end of the metal wire 110 is connected to the pad 91 with the other end corresponding to the position of the bump 120. As shown in FIG. 12E, a passivation layer 170 is formed on the insulating layer 100 to protect the structure below.

Figure 12F:
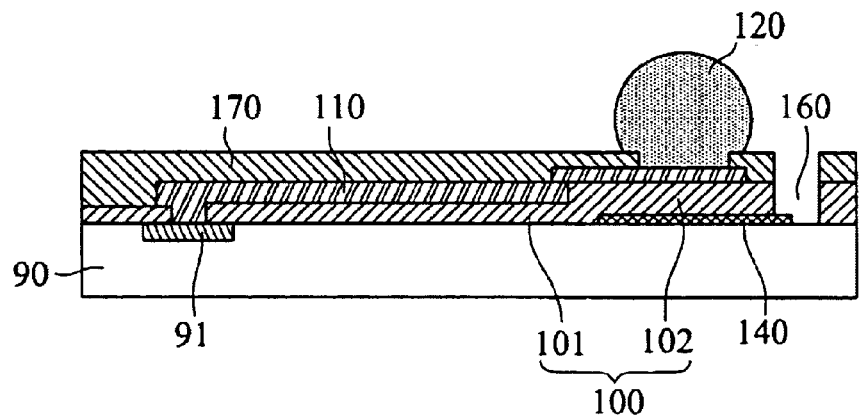
Figure 12G:
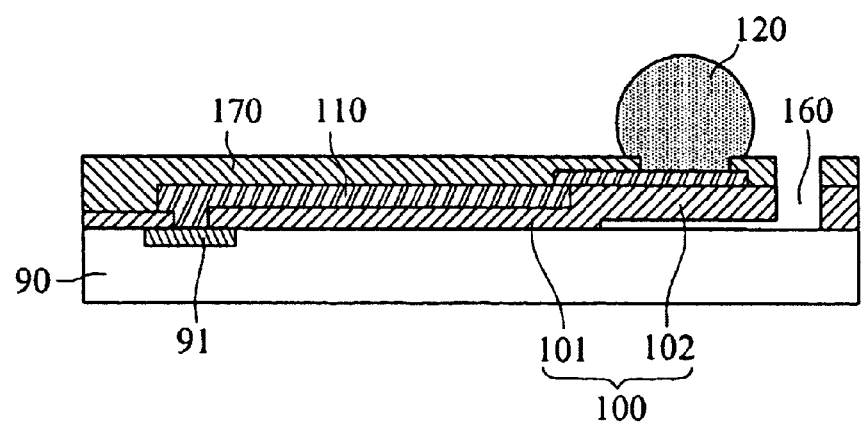

As shown in FIG. 12F, a bump 120 is formed at the position on the metal wire above the suspension part 102. Finally, as shown in FIG. 12G, the sacrificial layer 140 is removed to form the suspension structure of the suspension part 102.

The fabricating method for the third embodiment is similar to the one for the first embodiment. One only needs to skip the step of removing the sacrificial layer 140 described in FIG. 12G.

Certain variations would be apparent to those skilled in the art, which variations are considered within the spirit and scope of the claimed invention.

What is claimed is:

1. A wafer level packaging structure comprising:

a substrate, which contains a pad;

an insulating layer, which is installed on the substrate with a connection part that exposes the pad and a suspension part that suspends above the substrate;

a bump, which is formed above the suspension part; and a metal wire, which is installed above the connection part and the suspension part, electrically connecting the pad and the bump;

wherein the suspension part oscillates to release a stress received by the bump to protect the electrical connection between the bump and the pad.

2. The wafer level packaging structure of claim 1 further comprising a plurality of suspension beams installed on the insulating layer and connected to the bump to fortify the structural strength of the bump.

3. The wafer level packaging structure of claim 1 further comprising a sacrificial layer installed between the insulating layer and the suspension part, right below the bump.

4. The wafer level packaging structure of claim 3 further comprising a plurality of suspension beams installed on the insulating layer and connected to the bump to fortify the structural strength of the bump.

5. The wafer level packaging structure of claim 3, wherein the material of the sacrificial layer is selected from the group consisting of metals, epoxy, organic polymers, and inorganic oxides.

6. The wafer level packaging structure of claim 1 further comprising a sacrificial layer and an elastic layer, the former being installed above the latter and both of which being sandwiched between the substrate and the suspension part of the insulating layer right below the bump, wherein the elastic layer absorbs excess stress received by the bump to protect the electrical connection between the bump and the pad.

7. The wafer level packaging structure of claim 6 further comprising a plurality of suspension beams installed on the insulating layer and connected to the bump to fortify the structural strength of the bump.

8. The wafer level packaging structure of claim 6, wherein the material of the sacrificial layer is selected from the group consisting of metals, epoxy, organic polymers, and inorganic oxides.

9. The wafer level packaging structure of claim 1 further comprising an elastic layer installed between the substrate and the suspension part of the insulating layer below the bump, wherein the connection between the elastic layer and the substrate cracks to release the overloaded stress received by the bump.

10. The wafer level packaging structure of claim 9 further comprising a plurality of suspension beams installed on the insulating layer and connected to the bump to fortify the structural strength of the bump.

11. A wafer level packaging structure comprising:

a substrate, which contains a plurality of pads;

a first insulating layer, which is installed on the substrate to expose all of the pads;

a second insulating layer, which contains a first connection part and a second connection part connected together, the first connection part being installed above the first insulating layer and the second connection part being installed on the substrate, with the adhesive force between the second connection part and the substrate smaller than that between the first connection part and the substrate;

a plurality of bumps above the second connection part; and a plurality of metal wires, which are installed above the first connection part and the second connection part, electrically connecting the pads and the bumps;

wherein the connection between the second connection part and the substrate cracks when the stress received by the bump is overloaded.

12. The wafer level packaging structure of claim 11 further comprising a plurality of suspension beams installed on the second insulating layer and connected to the bump to fortify the structural strength of the bump.

* * * * *